United States Patent
Ohba et al.

(10) Patent No.: US 8,081,029 B2
(45) Date of Patent: Dec. 20, 2011

(54) DISTORTION COMPENSATION APPARATUS AND METHOD FOR DETECTING FAILURE IN THE SAME

(75) Inventors: Takeshi Ohba, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/763,326

(22) Filed: Apr. 20, 2010

(65) Prior Publication Data

US 2010/0271125 A1    Oct. 28, 2010

(30) Foreign Application Priority Data

Apr. 22, 2009   (JP) ................. 2009-104211

(51) Int. Cl.
    *H03F 1/26*    (2006.01)
(52) U.S. Cl. .................... 330/149; 330/136
(58) Field of Classification Search .......... 330/149, 330/129, 136, 279; 375/297; 455/63
    See application file for complete search history.

(56) References Cited

U.S. PATENT DOCUMENTS

| 5,742,201 | A  | * | 4/1998 | Eisenberg et al. | 330/2 |
| 6,252,455 | B1 | * | 6/2001 | Kurby et al. | 330/136 |
| 2006/0215783 | A1 | | 9/2006 | Shako et al. | |
| 2008/0068191 | A1 | * | 3/2008 | Maeda et al. | 340/635 |
| 2009/0027119 | A1 | * | 1/2009 | Williams et al. | 330/149 |

FOREIGN PATENT DOCUMENTS

| EP | 1 511 181 | 3/2005 |
| JP | 2006-270246 | 10/2006 |
| JP | 2006-279780 | 10/2006 |
| JP | 2008-78702 | 4/2008 |
| WO | 03/103166 | 12/2003 |

\* cited by examiner

*Primary Examiner* — Henry Choe
(74) *Attorney, Agent, or Firm* — Katten Muchin Rosenman LLP (57) ABSTRACT

There is provided a distortion compensation apparatus for compensating distortion of an output of a power amplifier included in a radio transmitter. The distortion compensation apparatus includes a difference value calculator to calculate a difference value between a reference signal and a feedback signal, where the reference signal is branched from an input signal to the power amplifier and the feedback signal is branched from an output from the power amplifier; an integrator to accumulate the difference value; and a failure determiner to determine based on the accumulated difference value whether or not a failure has occurred or not.

5 Claims, 10 Drawing Sheets

LUT

| $|X(t)|^2$ | ADDRESS VALUE | COMPENSATION FACTOR |
|---|---|---|
| $P_0$ | 0 | $h(p_0)$ |
| $P_1$ | 1 | $h(p_1)$ |
| $P_2$ | 2 | $h(p_2)$ |
| ⋮ | ⋮ | ⋮ |
| $P_{1023}$ | 1023 | $h(p_{1023})$ |

ABNORMAL OUTPUT

FIG. 7A

NORMAL OUTPUT

FIG. 7B

CASE OF ABNORMAL OUTPUT

FIG. 8A

CASE OF NORMAL OUTPUT

DISTORTION COMPENSATION APPARATUS AND METHOD FOR DETECTING FAILURE IN THE SAME

CROSS-REFERENCE TO RELATED APPLICATION

This application is based upon and claims the benefit of priority of the prior Japanese Patent Application No. 2009-104211, filed on Apr. 22, 2009, the entire contents of which are incorporated herein by reference.

FIELD

The embodiments discussed herein are related to a distortion compensation apparatus for compensating an output of a power amplifier equipped with such as a radio transmitter.

BACKGROUND

In a radio communication system, a plurality of adjacent channels are usually used for communication. Accordingly, for preventing or decreasing power leakage between these adjacent channels, it is important to suppress nonlinear distortion in the power amplifier mounted in the system by linearization of amplitude characteristics thereof. One of well-known devices for suppressing or compensating the nonlinear distortion is an adaptive predistortor distortion-compensation device which is used with a power amplifier in a radio transmitter. The power amplifier is hereinafter referred as the amplifier for the sake of simplicity.

In the adaptive predistortor distortion compensator, the nonlinear distortion is decreased with so-called predistortion processing in which the input signal into the amplifier is previously multiplied by compensation factor. The compensation factor has the inverse characteristic based on the nonlinear characteristic in the power amplifier. Since the compensated input signal is amplified by the amplifier having the nonlinear characteristic, the nonlinear characteristic of the amplifier is cancelled by the inverse characteristic in the input signal, nonlinearity in the output signal from the amplifier may be decreased.

Figure 6:
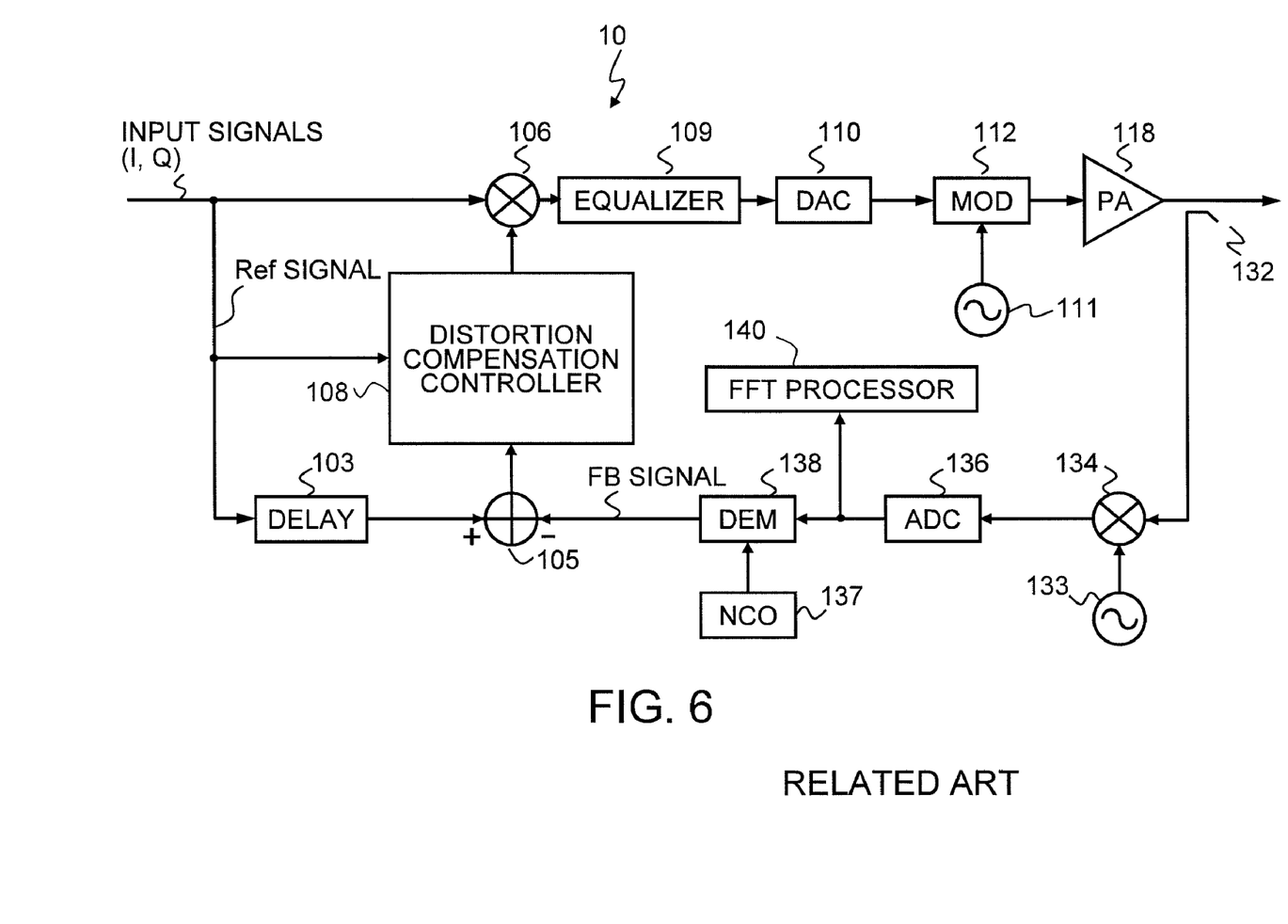
FIG. 6 is a diagram illustrating a configuration of a conventional distortion compensation apparatus.

Referring to FIG. 6, a device 100 as an example of conventional distortion compensation devices will be explained. The device 100 includes a transmitting system and a feedback system. The transmitting system is configured with a mixer 106, a distortion compensation controller 108, an equalizer 109, a digital-analog converter (DAC) 110, a local oscillator 111, a quadrature modulator (MOD) 112, and a power amplifier (PA) 118. In the device 100, the baseband signal including in-phase and quadrature signals is multiplied by the compensation factor generated with the distortion compensation controller 108 through the mixer 106, where an in-phase signal and a quadrature signal are referred as to I signal and Q signal respectively. Multiplying the input signals by the compensation factor is a so-call predistortion processing.

Then, I and Q signals outputted from the mixer 106 are fed to the equalizer 109 in which frequency characteristics of both signals are compensated. Successively, the I and Q signals are converted into analog signals individually by the DAC 110. With applying the I and Q signals in analog form to the quadrature modulator 112, a radio signal for transmission is generated as described below. In the quadrature modulator 112, a reference carrier signal of a radio frequency and a carrier signal are modulated (quadrature-modulated) with the I and Q signals respectively, and then are added each other to generate the radio signal, where the reference carrier signal and the carrier signal are provided by the local oscillator 111 and the phase of the carrier signal is different by 90° from that of the reference carrier signal. The radio signal is amplified to a specific level by the power amplifier 118 and then radiated into the air through an antenna (not illustrated in FIG. 6).

The feedback system in the device 100 is configured with a delay circuit 103, a calculating unit 105, a directional coupler 132, a local oscillator 133, a down-convertor 134, an analog-digital convertor (ADC) 136, a numerically controlled oscillator (NCO) 137, and a quadrature detector (DEM) 138. A part of the radio signal outputted from the power amplifier 118 is split by the directional coupler 132 and fed to the down-convertor 134 which mixes the radio signal with a signal generated by the local oscillator 133 to convert the radio signal to an intermediate-frequency signal. The intermediate-frequency signal is converted into a corresponding digital signal by the analog-digital converter 136. Subsequently the intermediate-frequency signal in digital form is processed by the quadrature detector 138 for quadrature detection to generate a baseband signal (an in-phase and a quadrature signals) using a signal fed from NCO 137

Hereinafter, a signal flowing in the feedback system is referred as to an FB signal for the sake of simplicity. The delay circuit 103 is arranged for adjusting the phase of the baseband signal (I and Q signals) as the reference signal to coincide with the phase of the FB signal as an output of the quadrature detector 138. The calculating unit 105 calculates the difference value or error between amplitudes of the Ref signal (reference signal) and the FB signal. The difference value is fed to the distortion compensation controller 108 in which the compensation factor allows the difference value to come close to zero. The adaptive predistortion distortion compensation devices such as described above are disclosed in International Publication Pamphlet No. WO2003/103166, Japanese Laid-open Patent Publications No. 2008-78702, 2006-270246, and 2006-279780 for example.

SUMMARY

According to an aspect of the invention, a distortion compensation apparatus for compensating distortion of an output of a power amplifier included in a radio transmitter includes a difference value calculator to calculate a difference value between a reference signal and a feedback signal, where the reference signal is branched from an input signal to the power amplifier and the feedback signal is branched from an output from the power amplifier; an integrator to accumulate the difference value; and a failure determiner to determine based on the accumulated difference value whether or not a failure has occurred or not.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

The conventional distortion-compensation device described in BACKGROUND has the FFT processor 140. The FFT processor 140 performs fast Fourier transform processing for the digital signal of the intermediate frequency outputted from the ADC 136 to monitor whether the device 100 operates correctly or not. That is, the device 100 determines detects the failure in distortion-compensation processing by the result obtained by the fast Fourier transform processing performed by the FFT processor 140.

Figure 7A:
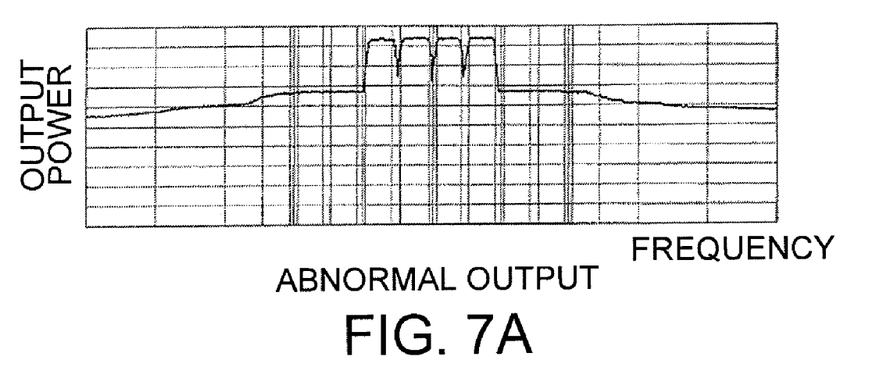
FIGS. 7A and 7B are diagrams illustrating measured examples of frequency spectrum of outputs of a power amplifier.
Figure 7B:
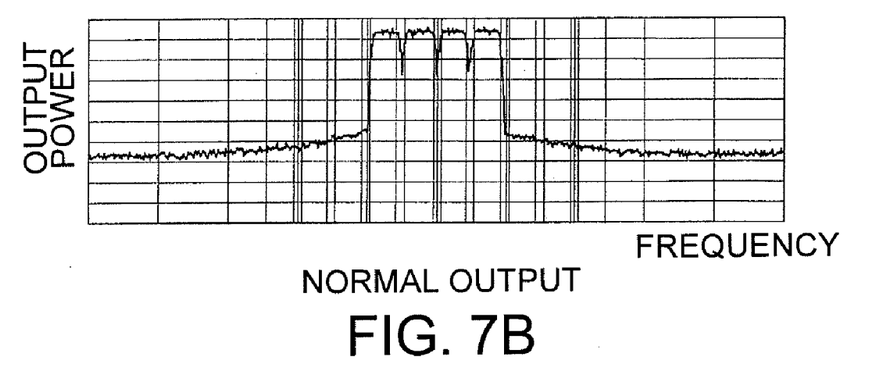
Figure 8A:
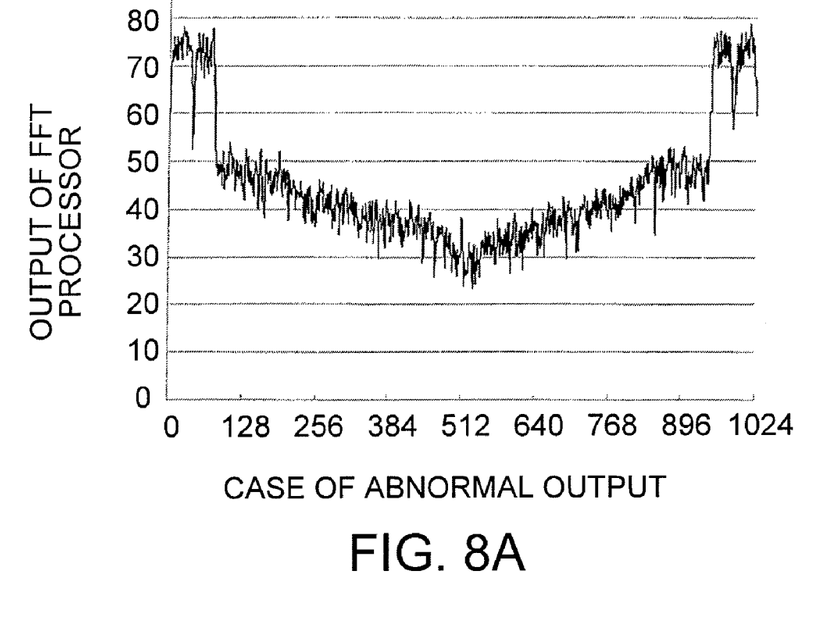
FIGS. 8A and 8B are diagrams individually illustrating output of FFT processor in the conventional distortion compensation apparatus.
Figure 8B:
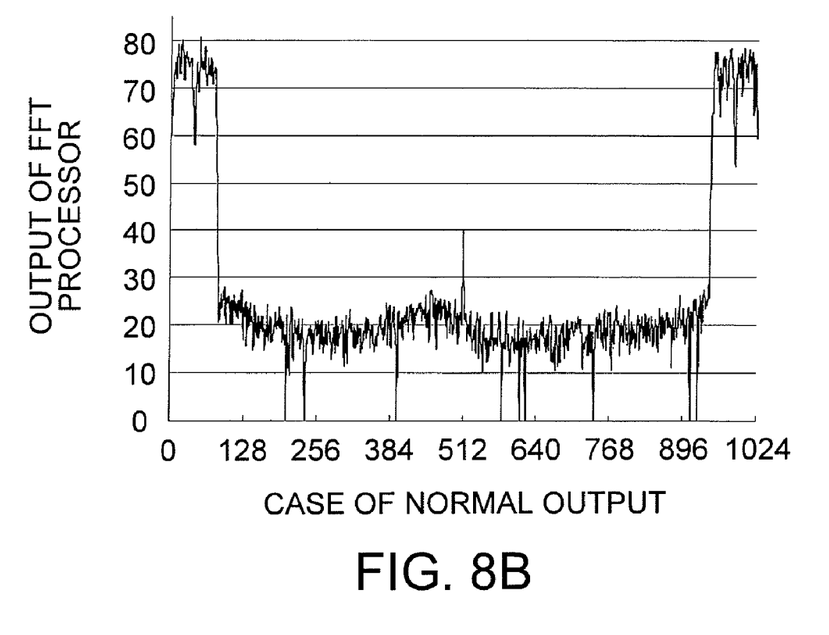
Figure 9A:
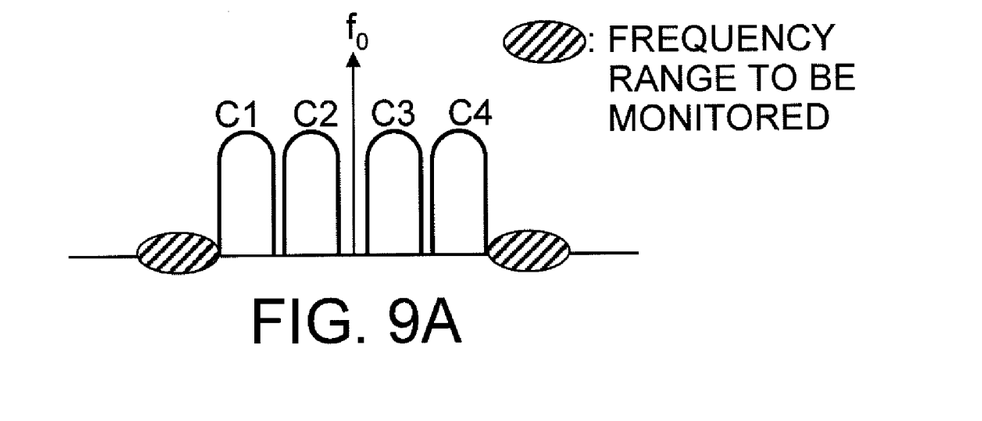
FIGS. 9A to 9C are diagrams illustrating a relationship between frequency range to be monitored and carrier(s)
Figure 9B:
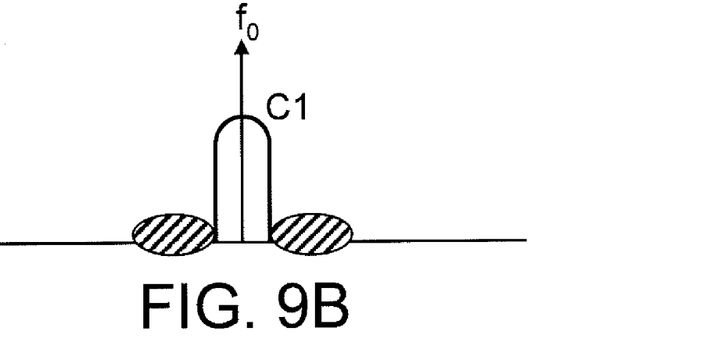
Figure 9C:
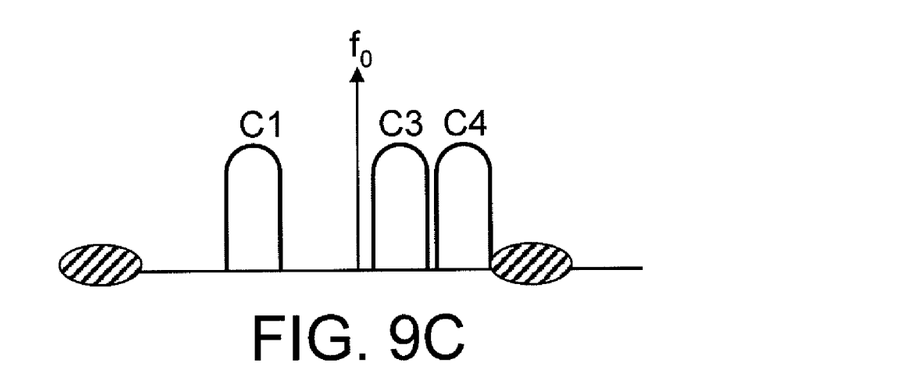

Further, referring to FIGS. 7A to 9C, the method for failure detection by the device 100 will be described below. FIGS. 7A and 7B illustrate a failure and a successful cases in distortion compensating by the device 100 respectively. FIGS. 7A and 7B depict individually the measured output power outputted from the power amplifier 118, where each output power having four carriers is measured in the form of frequency spectrum. FIGS. 8A and 8B illustrate individually the output of the FFT processor 140 in the failure and the successful cases corresponding to FIGS. 7A and 7B respectively. FIGS. 9A to 9C illustrate individually the relationship between the carrier(s) and the frequency range(s) to be monitored for the distortion-compensating to be failed or succeed.

Referring to FIG. 7A, levels of the side lobes around the four carriers are higher than those illustrated in FIG. 7B. This means that a channel or channels adjacent the four carriers suffer from the leakage of the output power from the PA 118 and the interferences may be caused between the adjacent channel(s) and some of the four carriers. That is, the leakage may appear as noise in the adjacent channel communication to deteriorate the quality of communication. The outputs depicted in FIGS. 8A and 8B are individually resultant output signal of the FFT processor 140, which processes the signals down-converted in digital form by processing the feed back signal from the PA 118 by the down converter 134 and ADC 136. Accordingly, the waveform in FIG. 8A has raised side lobes in the case of failure as illustrated in FIG. 7A. In FIGS. 8A and 8B, the illustrated waveforms are resultant waveforms processed with FFT points of 1024 and the waveform corresponding to two carriers are both side regions of diagrams. FIGS. 7A and 8A give suggestion that monitoring the resultant output of FFT processor 140 may detect the success or failure in the distortion compensation processing by measuring the power lowering levels at the regions around the four carrier frequencies, for example.

However this method has several disadvantages in applying to actual practice. First, it is desired to change the frequency range of processing result by FFT to be monitor at each time when the carrier frequency is changed. As illustrated in FIG. 9A, since the carrier or carrier wave are C1 to C4, where each of C1 to C4 is depicted as one having band frequency, the frequency ranges to be monitored are a range (lower range) lower than C1 and a range (higher range) higher than C4, where the lower and higher ranges are corresponding to side lobe of C1 and C4 individually and are depicted with hatched lines. When a carrier is a single as illustrated in FIG. 9B, the frequency ranges to be monitored are both sides around the carrier C1. Further, when the carriers are C1, C3, and C4, the frequency ranges to be monitored are a little higher frequency range than a frequency range of the carrier C4 and a frequency a little apart from the carrier C1, as illustrated in FIG. 9C, in consideration of the fourth order distortion. As described above, the frequency regions to be monitored may be decided according to the order with high frequency and the inter modulation characteristic at every time when setting the carrier or the carriers. Accordingly, changing the carrier(s) will need a complicated process.

Second, the FFT processing needs a large size hardware if the FFT processing performs by a hardware and consequently the FFT processing cost will become expensive. Further, the FFT processing performed by software may be desired a large amount of calculation to allow the CPU to load a heavy duty.

Accordingly, it is desirable to improve a method and/or a device capable of performing with a low duty the detection of the failure in the distortion compensation of an output from a power amplifier used in a wireless transmitting.

Now it will be explained that preferable embodiments for improving a distortion compensation of an output from the power amplifier used such as in a wireless transmitting. The preferable embodiments explained below intend to perform, with low cost and low duty, the detection of failure in the distortion compensation.

Figure 1:
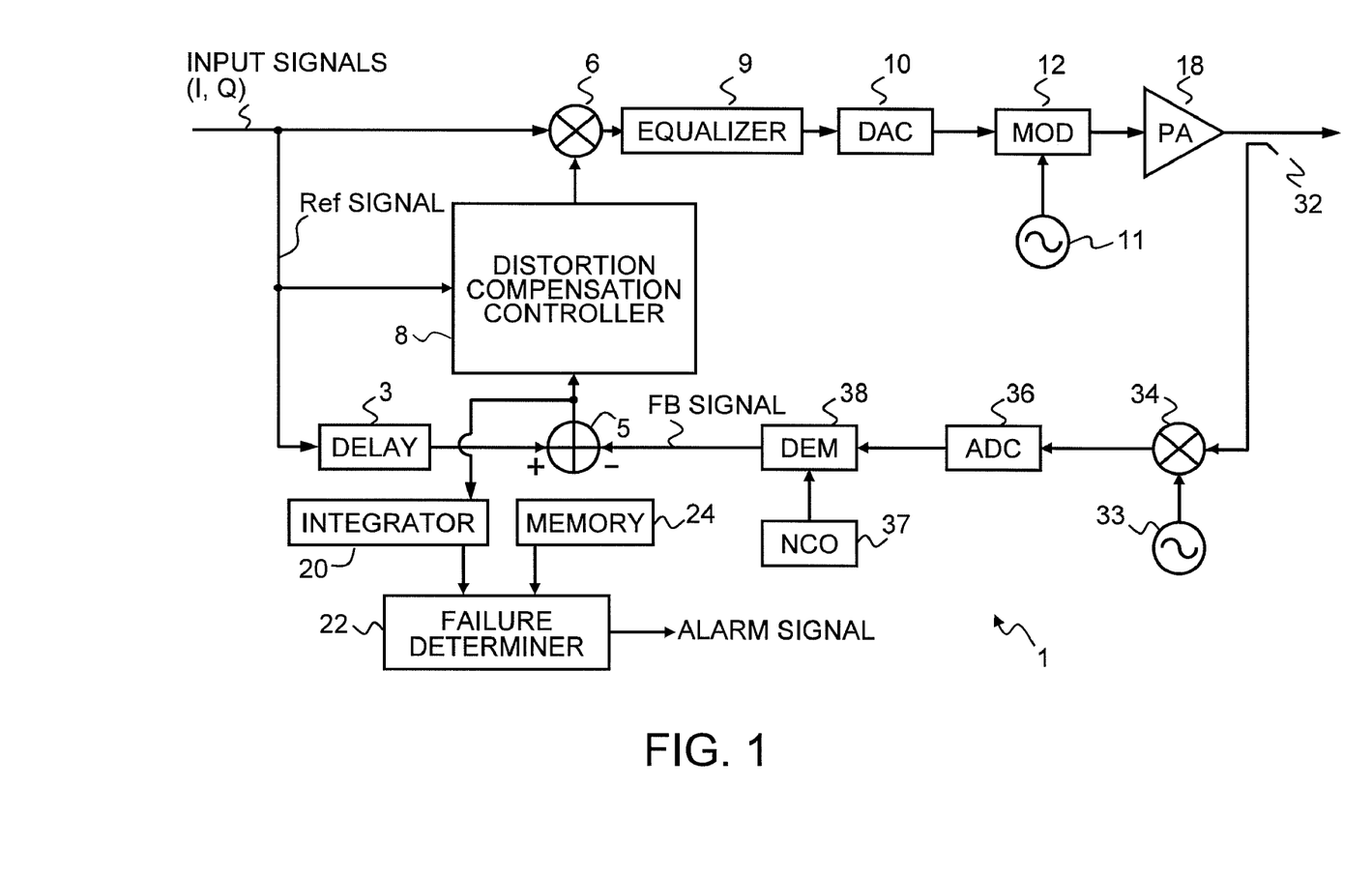
FIG. 1 is a block diagram illustrating a configuration of a distortion compensation apparatus according to an embodiment.

As illustrated in FIG. 1, the distortion compensation apparatus 1 is configured with a transmitting system, a feed back system, and a failure detecting system.

The transmitting system includes a mixer 6, a distortion compensation controller 8, an equalizer 9, a digital-analog converter (DAC) 10, a local oscillator 11, a quadrature modulator (MOD) 12, and a power amplifier (PA) 18. For compensating the nonlinearity caused in the power amplifier 18, the mixer 6 multiplies a baseband signal including an in-phase signal and a quadrature signal by a compensation factor generated by the distortion compensation controller 8. In this processing, a predistortion processing is performed. The baseband signal processed by the predistortion processing is fed to the equalizer 9 by which the frequency characteristic is compensated. Then the baseband signal is converted into an analog signal by the DAC 10. Then the in-phase signal and the quadrature signal in the baseband signal in analog form modulate individually the reference carrier signal in a wireless frequency and a carrier signal shifted from the reference carrier signal by 90° by the MOD 12, and the modulated signals are added, where the reference carrier signal and the carrier signal are generated by the local oscillator 11. The output signal from the MOD 12 as a transmitting radio signal is led to PA 18 and amplified to a degree of a desired level, and then is transmitted from an antenna (not illustrated in FIG. 1).

The feedback system in the distortion compensation apparatus 1 includes a delay circuit 3, a calculating unit 5 as a difference calculating unit, a directional coupler 32, a local oscillator 33, a down-convertor 34, an analog-digital convertor (ADC) 36, a numerically controlled oscillator (NCO) 37, and a quadrature detector (DEM) 38. A part of the radio signal outputted from the PA 18 is split to the feedback system trough the directional coupler 32. The part of the radio signal is mixed with a signal through the local oscillator 33 to be converted to a signal of intermediate frequency, and then is converted to a digital signal by the ADC 36. Subsequently, the quadrature detector 38 executes the quadrature detection to the signal of the intermediate frequency by using the signal from the NCO 37 to generate a baseband signal including in-phase and quadrature signals.

Hereinafter, as mentioned above, the signal(s) in the feedback system is described as FB signal(s) also in the embodiments. The delay circuit 3 adjusts the phases of the baseband signal as a Ref signal and the baseband signal outputted from the quadrature detector 38 to conform to each other. The calculating unit 5 calculates a difference value or an error between both amplitudes of the Ref signal and the FB signal from the quadrature detector 38 and sends the difference value as a feedback signal to the distortion compensation controller 8. The distortion compensation controller 8 determines a compensation factor so that the difference closes in a zero.

In the distortion compensation apparatus 1, the failure detecting system includes an integrator (accumulator) 20, a memory 24, and a failure determiner 22. The integrator 20 composed of such as a digital counter accumulates the difference values calculated by the calculating unit 5 and sends successively the accumulated value or the count value to the failure determiner 22. The failure determiner 22 compares the accumulated value with a threshold amount stored in the memory 24, and generates an alarm signal for notifying the failure in the distortion compensation apparatus if the accumulated value exceeds the threshold amount.

Figure 2:
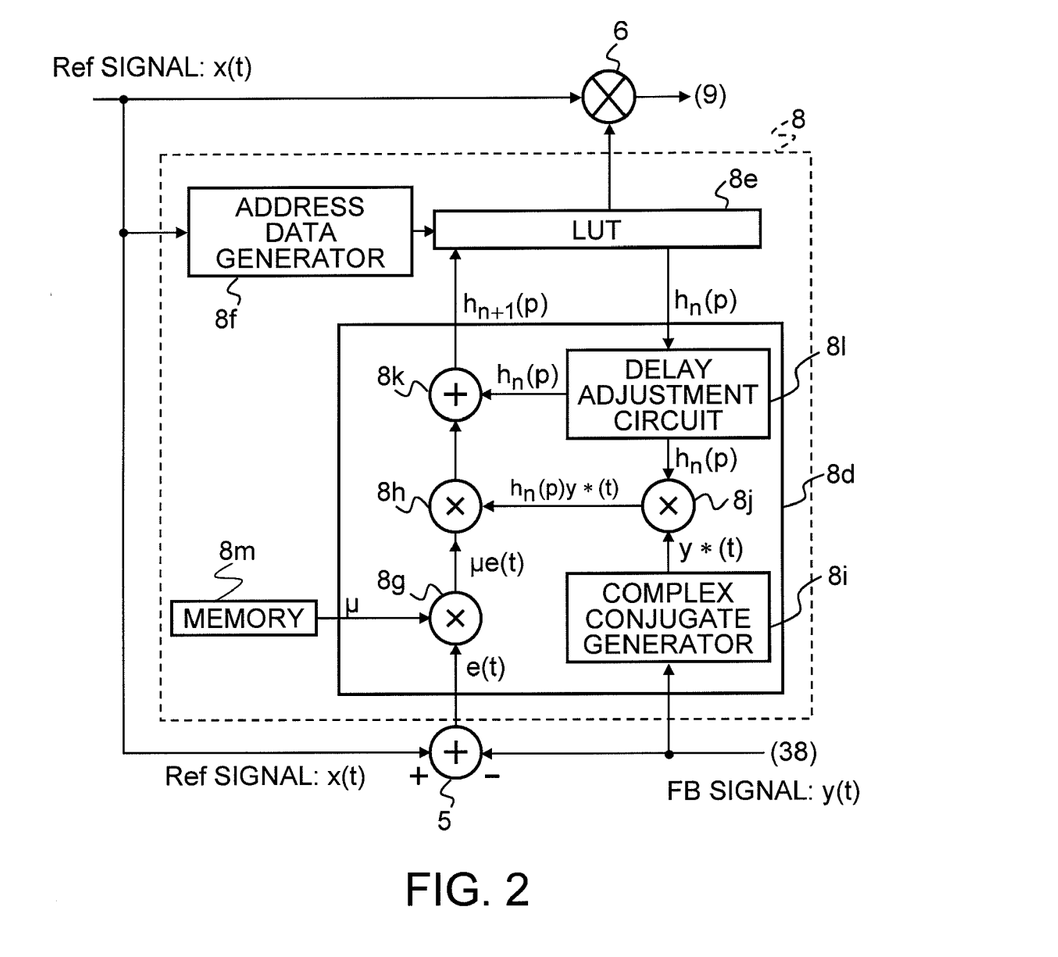
FIG. 2 is a block diagram of an example of a configuration of a distortion compensation controller of the distortion compensation apparatus.

Referring to FIG. 2, an example of a configuration of the distortion compensation controller 8 will be explained. FIG. 2 illustrates the block diagram of the distortion compensation controller 8 and its periphery units or parts. The distortion compensation controller 8 may be configured with such as a digital signal processor (DSP) and includes a calculating unit 8d, a look up table (LUT) 8e, address data generator 8f, and a memory 8m.

The calculating unit 8d calculates a compensation factor $h_{n+1}(p)$ which is multiplied with the Ref signal, based on a previously calculated compensation factor $h_n(p)$ and the difference value calculated by the calculating unit 5. The suffix "n" is a repeat count and the variable "p" is power of the Ref signal, that is input power $P=(I^2+Q^2)$ where I is a value of the in-phase signal and Q is a value of the quadrature signal and $P=(I^2+Q^2)^{(1/2)}$ may be used instead of $P=(I^2+Q^2)$. The compensation factor $h_n(p)$ is repeatedly calculated according to the difference between the Ref signal and FB signal. Hereinafter, the compensation factor is representatively described as $h_k(p)$, k is an integer and 1 or more than one.

As illustrated in FIG. 2, a flow for obtaining the (n+1)th compensation factor $h_{n+1}(p)$ using the previously obtained nth compensation factor $h_n(p)$. In more detail, the compensation factor $h_{n+1}(p)$ may be obtained, as described below, by an adaptive signal processing using the least mean square (LMS) algorithm. Hereinafter, the input signal, that is, the Ref signal including the in-phase and the quadrature signals is expressed as a complex expression X(t), the FB signal corresponding to the input signal is expressed as a complex expression y(t), and the difference value or error is expressed as e(t).

First, using the multiplier 8g, the difference value is multiplied by μ which corresponds to a step parameter size as an updating amount for calculating the next compensation factor. Then, by using the multiplier 8h, the result μe(t) is multiplied by $h_n(p) \times y^*(t)$ by the multiplier 8h, where $h_n(p) \times y^*(t)$ is a result of multiplication of complex conjugate feedback signal y*(t) by the compensation factor $h_n(p)$ using a multiplier 8j. The y*(t) is generated from the FB signal y(t) using a complex conjugate generator 8i. Then, the result $h_n(p) \times y^*(t) \times \mu \times e(t)$ is added to the nth compensation factor $h_n(p)$ by an adder 8k to generate the n+1th compensation factor. The tinning of the nth compensation factor $h_n(p)$ is altered by a delay adjustment circuit 8l to be inputted in the adder 8k and the multiplier 8j.

Calculated compensation factors $h_k(p)$s are successively stored in the LUT as follows. The LUT 8e is a table storing each of the compensation factors h(p)s related to one of addresses determined based on the power of Ref signal. Upon receiving address signal from an address generator 8f, the LUT 8e selects a compensation factor corresponding to the power of the input signal (Ref signal) using the received address, and then outputs the compensation factor h(p) to the mixer 6. The address generator 8f generates an envelop signal of the Ref signal x(t), which has not been compensated, to determine an address signal corresponding to power obtained from the envelop signal. The address signal, for example, may be expressed with a 10-bit address value, that is, one of 0 to 1023. Further, the address data generator 8f includes a delay adjuster (not illustrated) for delaying and outputting the address signal when the LUT 8e updates the compensation factor to $h_{n+1}(p)$.

Figure 3:
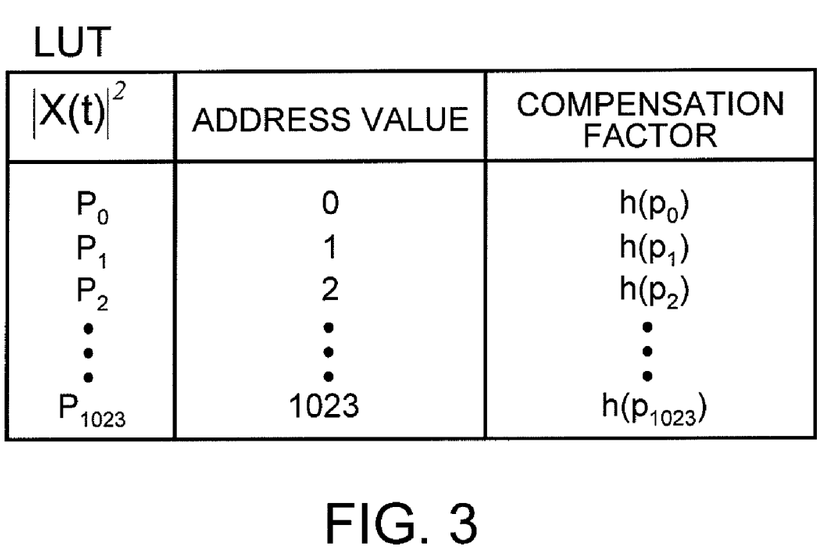
FIG. 3 is an example of a table included in LUT of the distortion compensation controller.

FIG. 3 depicts a diagram of an example of the table included in LUT 8e. In the table, power $P_i$ corresponds to quantized power of the power of the input signal, each of the address values corresponds to each of the power $P_i$s, and each of the address values corresponds to each of the compensation factors $h(p_i)$ where i is an integer and one of 0 to 1023.

The LUT 8e selects the compensation factor h(p) according to the address value associated with the address signal supplied from the address generator 8f. Then the LUT 8e outputs the compensation factor h(p) to the mixer 6. The mixer 6 multiplies the input signal X(t) by the compensation factor h(p), where the multiplication performed in the mixer 6 may perform for complex numbers since the input signal x(t) and the compensation factor h(p) have individually the in-phase and quadrature signals corresponding to real and imaginary parts.

If the distortion compensation control described above is performed correctly, the non-linearity in the power amplifier 18 may be increased or eliminated to a desired degree by the predistortion. Accordingly, it may be allowed that the input signal (Ref signal) and the baseband signal approximately conform to each other, where the baseband signal (the FB signal from the quadrature detector 38) is a signal generated based on the feed back signal from the power amplifier 18. Consequently, the difference value e(t) in FIG. 2 calculated by the calculating unit 5 may reach to zero or to negligibly small value. On the contrary, if the difference value maintains continuously a large value, two cases will be considered. First, the feedback system falls in failure, such as in the power amplifier 18, the down convertor 34, or the quadrature detector 38, by which the FB signal exceeds considerably the desired value. Second, the failure occurs in spite of proper operation of the each part in the distortion compensation controller 8. For detecting the failure or failures, it is preferable to monitor the difference value calculated by the calculating unit 5. From this viewpoint, the distortion compensation apparatus 1 according to embodiments intends to detect a failure or failures by the method in which the difference values from the calculating unit 5 are integrated and the value of integral, which described as the accumulated value or count value outputted from integrator 20, is compared with a predetermined value.

Figure 4A:
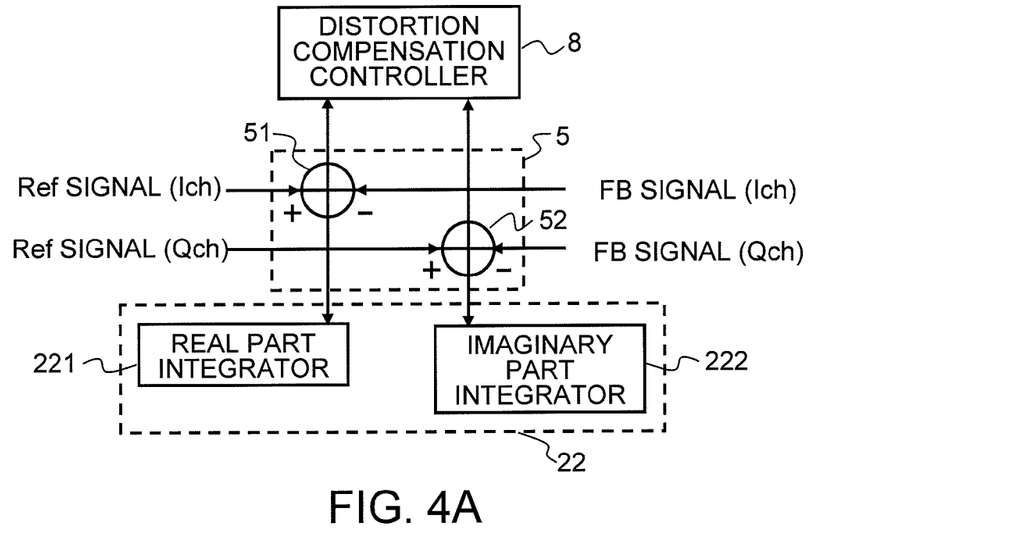
FIGS. 4A and 4B are examples of configurations for detecting failure in the distortion compensation apparatus.
Figure 4B:
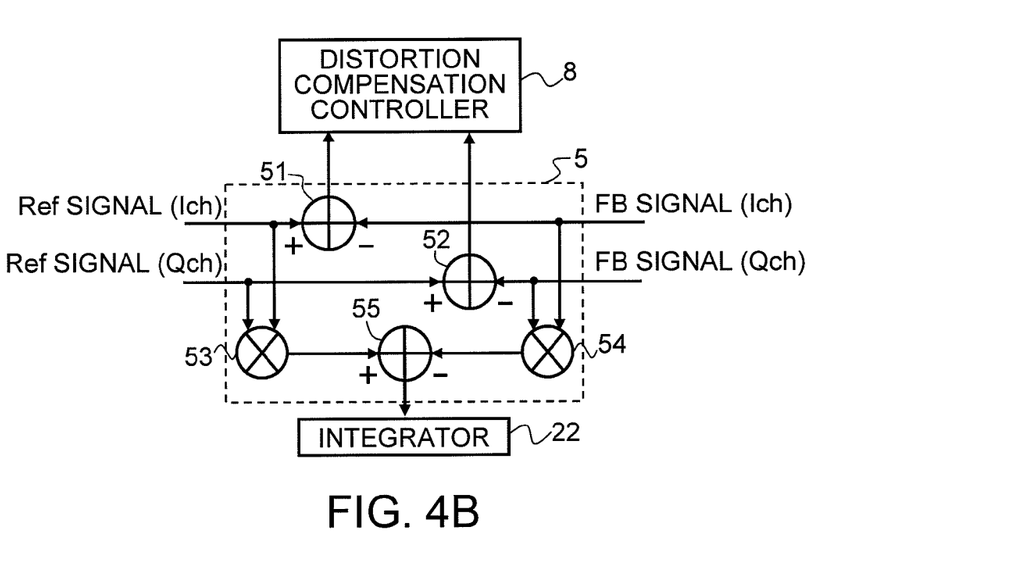

Next, referring to FIGS. 4A and 4B, the details of configurations for detecting a failure or failures are explained. Either the configuration illustrated in FIG. 4A or illustrated in FIG. 4B may be applied to the distortion compensation apparatus according to the embodiment.

The calculating unit 5 illustrated in FIG. 4A includes a subtractor 51 for calculating the difference between both amplitudes of the in-phase signals of the Ref signal and the FB signal, and a subtractor 52 for calculating the difference between both amplitudes of the quadrature signals of the Ref signal and the FB signal. The integrator 20 includes a real-part integrator 221 for integrating the count value from the subtractor 51 and an imaginary-part integrator 222 for integrating the count value from the subtractor 52. In FIG. 4A, the failure determiner 22 (not illustrated in FIG. 4A) compares each of the values of integral from the real-part integrator 221 and the imaginary-part integrator 222 with each of predetermined threshold values respectively. Then, when one or both of values of integral exceeds or exceed the corresponding predetermined threshold value or values, the failure determiner 22 will generate an alarm signal.

Figure 10:
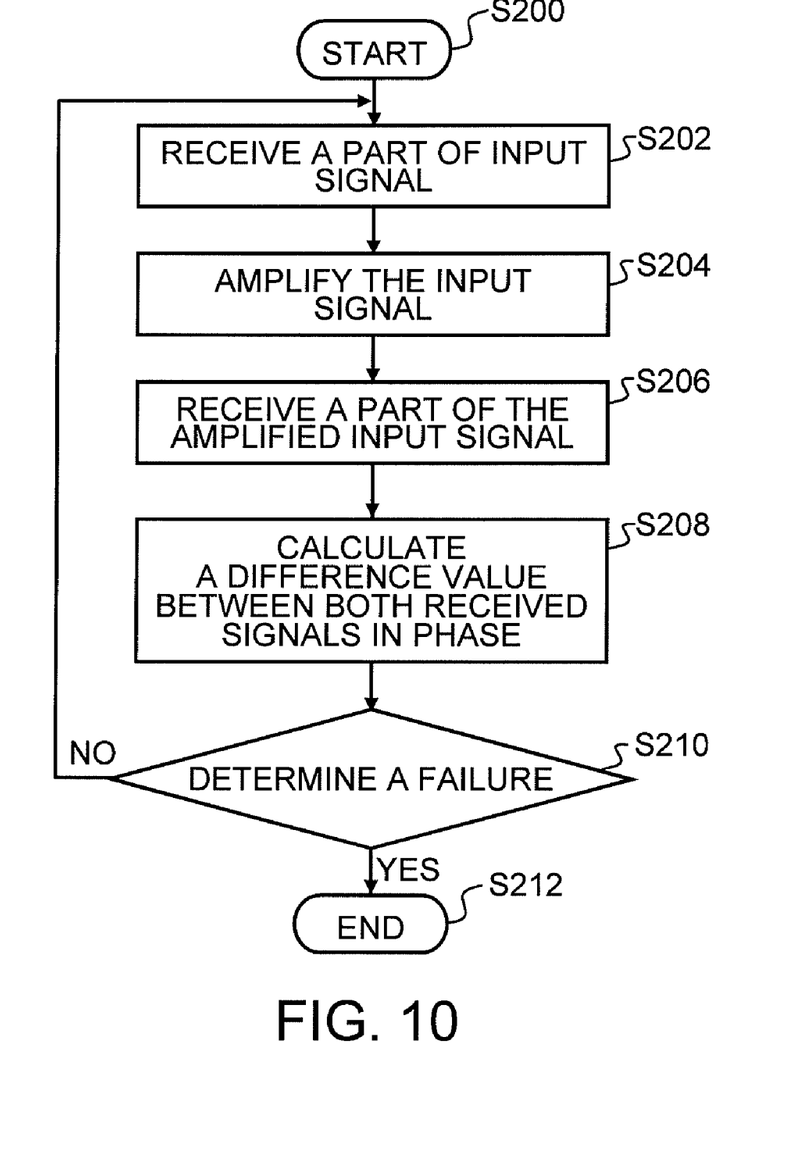
FIG. 10 is a diagram illustrating an example of a flowchart of processes executed in the distortion compensation apparatus according to the embodiment.

Next referring to FIG. 4B, another calculating unit 5 will be explained. The calculating unit 5, illustrated in FIG. 4B, further includes multipliers 53 and 54, and a subtractor 55 in addition to the configuration illustrated in FIG. 4A. The multiplier 53 multiplies the in-phase signal and the quadrature signal of the Ref signal, and the multiplier 54 multiplies the in-phase signal and the quadrature signal of the FB signal. Subsequently, the subtractor 55 subtracts an output value of the multiplier 54 from an output value of the multiplier 53. The outputs from the subtractors 51 and 52 illustrated in FIG. 4B are used only in calculation in the distortion compensation controller 8. The calculating unit 5, illustrated in FIG. 4B, outputs the difference value of power between the power of the Ref signal and the power of the FB signal. Consequently, the integrator 20 integrates the difference value of power and outputs an alarm signal when the value of integral exceeds a predetermined threshold. Further, referring to FIGS. 1 and 10, a flowchart of processes for compensating a distortion in the distortion compensation apparatus 1 will describe briefly. The Ref signal branched from the input signal is received by the calculating unit 5 via the delay circuit 3 (S202). The input signal is amplified by PA 18 (S204). A part of the amplified input signal branches to the feedback system (S206). The Ref signal and the part of the amplified input signal are in phase and subtracted each other by the calculating unit 5 to obtain the difference value (S208), and then the difference value is integrated by the integrator 20. The integrated difference value is led to the failure determiner 22 to determine whether or not the failure of the distortion compensation apparatus has occurred (S210). If the failure has not occurred, the processing will go to S202.

Figure 5A:
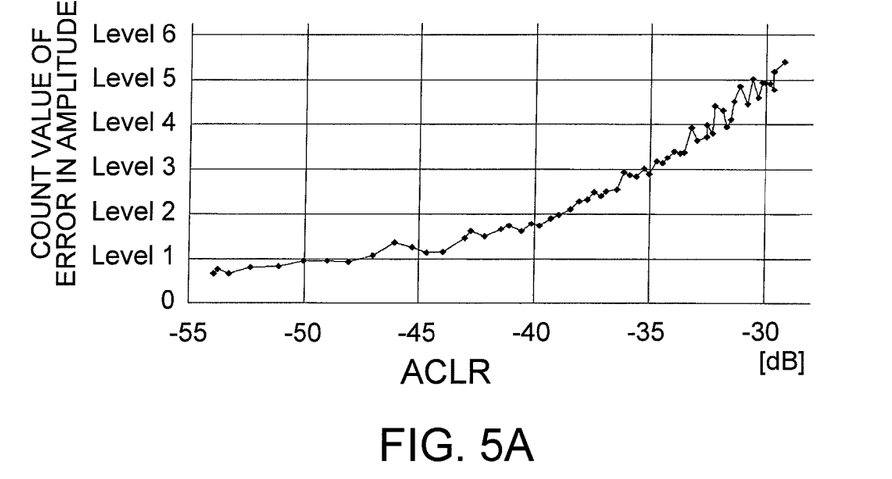
FIGS. 5A and 5B are diagrams illustrating relationship between ACLR and a count value to be monitored individually.
Figure 5B:
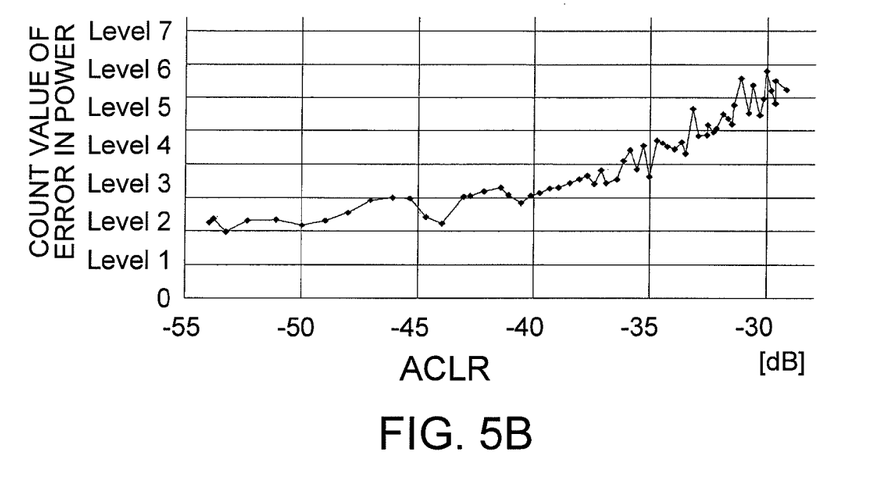

Next, referring to FIGS. 5A and 5B, an explanation will be described about the relationship between the adjacent channel leakage power ratio (ACLR) in the horizontal axis and the count value calculated by integrator 20 in a vertical axis. FIGS. 5A and 5B illustrate test results measured under the specific conditions. The vertical axis is for representing levels of the count value quantized, where the count value is calculated in the integrator 22. FIG. 5A illustrates the relationship between ACLR and the count value (the value of integral) of the error between the amplitudes of the Ref signal and the FB signal, where each of these values are measured using the configuration illustrated in FIG. 4A. The relationship illustrated in FIG. 5A indicates that the count value monotonically increases to ACLR. Further, FIG. 5B illustrates the relationship between ACLR and the count value (the value of integral) of the error between the power of the Ref signal and the FB signal, where each of these values are measured using the configuration illustrated in FIG. 4A. The relationship illustrated in FIG. 5B indicates also that the count value monotonically increases to ACLR. The relationships or graphs illustrated in FIGS. 5A and 5B indicates that ACLR increasing too much will be detected by monitoring the count value of the error between the amplitudes of the Ref and FB signals or the error between each power of the RF and FB signals. Accordingly, each threshold of the error of the count value and the power may be determined to detect whether the ACLR has exceed a allowable value or not.

As described above, the distortion compensation apparatus according to the embodiments executes the predistortion processing based on the difference value between the reference signal (Ref signal) and the feedback signal (FB signal) in phase with the reference signal, where the reference signal branched from the baseband signal inputted and the feedback signal branched from the output signal of the power amplifier. Accordingly, the distortion compensation apparatus compensates the distortion in the output of the power amplifier and includes the failure-detection function for detecting a failure in compensating the distortion. By the failure-detection function, the failure or success in compensating the distortion is determined by comparing the value of integral of the difference value used in the predistortion. Since the failure detection function may be configured with only a counter for counting the difference value and comparator, the failure detection may be perform by a cost effective and few burdens of processing method.

In the embodiments described above, the distortion compensation apparatus and the method therefore according to the present invention does not limited within the embodiments and may be modified in many ways.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A distortion compensation apparatus for compensating distortion of an output of a power amplifier included in a radio transmitter comprising:
    a difference value calculator to calculate a difference value between a reference signal and a feedback signal, the reference signal being branched from an input signal to the power amplifier and the feedback signal being branched from an output from the power amplifier;
    an integrator to accumulate the difference value; and
    a failure determiner to determine based on a comparison between a stored threshold level and the accumulated difference value whether or not a failure has occurred.

2. The distortion compensation apparatus according to claim 1, wherein the difference value is calculated based on in-phase signals or quadrature signals of the reference signal and the feedback signal.

3. The distortion compensation apparatus according to claim 1, wherein the difference value is calculated based on in-phase signals and quadrature signals of the reference signal and the feedback signal.

4. The distortion compensation apparatus according to claim 1, wherein the difference value is calculated based on a value of power on the input signal to the power amplifier.

5. A method for detecting a failure in a distortion compensation apparatus for compensating distortion of an output of a power amplifier included in a radio transmitter, the method comprising:

calculating a difference value between a reference signal and a feedback signal, the reference signal being branched from an input signal to the power amplifier and the feedback signal being branched from an output from the power amplifier, the reference signal and the feedback signal being reference signal be in phase;

integrating the difference value; and determining based on a comparison between a stored threshold level and the integrated difference value whether or not a failure has occurred.

* * * * *